(12) United States Patent
Lee et al.

(10) Patent No.: US 10,629,839 B2
(45) Date of Patent: Apr. 21, 2020

(54) LIGHTING APPARATUS USING ORGANIC LIGHT EMITTING DIODE

(71) Applicant: LG Display Co., Ltd., Seoul (KR)

(72) Inventors: JungEun Lee, Seoul (KR); NamKook Kim, Suwon-si (KR); TaeOk Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/032,131

(22) Filed: Jul. 11, 2018

(65) Prior Publication Data
US 2019/0019979 A1  Jan. 17, 2019

(30) Foreign Application Priority Data
Jul. 11, 2017  (KR) .................. 10-2017-0088077

(51) Int. Cl.
| | |
|---|---|
| *H01L 51/52* | (2006.01) |
| *H01L 51/00* | (2006.01) |
| *H01L 51/56* | (2006.01) |
| *H01L 27/32* | (2006.01) |

(52) U.S. Cl.
CPC ...... *H01L 51/5212* (2013.01); *H01L 27/3211* (2013.01); *H01L 51/0097* (2013.01); *H01L 51/5218* (2013.01); *H01L 51/5246* (2013.01); *H01L 51/5268* (2013.01); *H01L 51/5271* (2013.01); *H01L 51/5275* (2013.01); *H01L 51/56* (2013.01); *H01L 2251/308* (2013.01); *H01L 2251/5338* (2013.01); *H01L 2251/5361* (2013.01); *H01L 2251/5369* (2013.01)

(58) Field of Classification Search
CPC ............ H01L 51/5212; H01L 51/0097; H01L 51/5218; H01L 51/5246; H01L 51/5268; H01L 51/5271; H01L 51/5275; H01L 51/56; H01L 2251/308; H01L 2251/5338; H01L 2251/5361; H01L 2251/5369; H01L 27/3211
See application file for complete search history.

(56) References Cited

U.S. PATENT DOCUMENTS

| | | | | |
|---|---|---|---|---|
| 6,812,637 | B2 * | 11/2004 | Cok | ............ H01L 51/5206 313/503 |
| 10,312,471 | B2 * | 6/2019 | Fujimaki | .......... H01L 51/5259 |
| 2012/0070942 | A1 * | 3/2012 | Fedorovskaya | ....... C23C 16/403 438/127 |
| 2013/0228786 | A1 * | 9/2013 | Park | ............... H01L 51/5268 257/72 |

(Continued)

FOREIGN PATENT DOCUMENTS

| | | |
|---|---|---|
| CN | 105702875 A | 6/2016 |
| CN | 106463644 A | 2/2017 |

OTHER PUBLICATIONS

Office Action dated Dec. 17, 2019 issued in a corresponding Chinese Patent Application No. 201810754250.2 (22 pages).

*Primary Examiner* — Mark W Tornow
(74) *Attorney, Agent, or Firm* — Polsinelli PC

(57) ABSTRACT

A lighting apparatus of the present disclosure divides a plurality of pixels and configures an auxiliary electrode which transmits a signal to the first substrate with a metal nano ink so that the light which is reflected from the interface between the first substrate and an external air layer to be incident is reflected and scattered again to improve the luminous efficiency of the lighting apparatus.

20 Claims, 11 Drawing Sheets

(56) References Cited

U.S. PATENT DOCUMENTS

2014/0061595 A1\* 3/2014 Kim .................. H01L 27/3244
 257/40
2016/0172618 A1\* 6/2016 Chen .................. H01L 51/5212
 257/40

\* cited by examiner

LIGHTING APPARATUS USING ORGANIC LIGHT EMITTING DIODE

CROSS-REFERENCE TO RELATED APPLICATION

This application claims the priority of Korean Patent Application No. 10-2017-0088077 filed on Jul. 11, 2017, in the Korean Intellectual Property Office, the disclosure of which is incorporated herein by reference in its entirety.

BACKGROUND

Field of the Disclosure

The present disclosure relates to a lighting apparatus with an improved luminous efficiency.

Description of the Background

Currently, fluorescent lamps or incandescent lamps are mainly used as lighting apparatus. Among them, the incandescent lamps have a good color rendering index (CRI), but have a very low energy efficiency. Further, the fluorescent lamps have a good efficiency, but have a low color rendering index and contain mercury, which may cause an environmental problem.

In order to solve the problems of the lighting apparatus, recently, a light emitting diode (LED) is suggested as a lighting apparatus. The light emitting diode is configured by an inorganic light emitting material. A luminous efficiency is the highest in the blue wavelength range and the luminous efficiency is lowered toward a red wavelength range and a green wavelength range which has the highest visibility. Therefore, there is a problem in that when a red light emitting diode, a green light emitting diode, and a blue light emitting diode are combined to emit white light, the luminous efficiency is lowered. Further, there is another problem in that when the red light emitting diode, the green light emitting diode, and the blue light emitting diode are used, since widths of emission peaks are narrow, the color rendering property is also deteriorated.

In order to solve the above-described problems, there has been proposed a lighting apparatus which outputs white light by combining a blue light emitting diode and a yellow fluorescent material to output white light, instead of combination of the red light emitting diode, the green light emitting diode, and the blue light emitting diode. The reason why the light emitting diode configured as described above is proposed is that it is more effective to use only a blue light emitting diode having a high efficiency and a fluorescent material which receives blue light to emit yellow light for the remaining colors than to use a green light emitting diode having a low luminous efficiency.

However, in the case of the lighting apparatus which combines the blue light emitting diode and a yellow fluorescent substance to output white light, since the fluorescent material which emits yellow light has a low luminous efficiency, there is a limitation in improvement of the luminous efficiency of the lighting apparatus.

In order to solve the problem in that the luminous efficiency is deteriorated, a lighting apparatus using an organic light emitting diode formed of an organic light emitting material has been proposed. Normally, the organic light emitting diode has relatively excellent luminous efficiencies of red and green light as compared with an inorganic light emitting diode. Further, widths of emission peaks of blue, red, and green light of the organic light emitting diode are relatively broader than that of the inorganic light emitting diode so that a color rendering property is improved. Therefore, there is an advantage in that light of the light emitting device is more similar to the sunlight.

However, the lighting apparatus using an organic light emitting diode as described above has the following problems.

Since the lighting apparatus including an organic light emitting diode which outputs white light is configured by a plurality of layers having different refractive indexes, emitted light passes through the plurality of layers to be output to an external air layer. Therefore, when the light passes through the plurality of layers, the light is refracted to cause light loss so that an optical efficiency is lowered.

SUMMARY

Accordingly, the present disclosure is to provide a lighting apparatus in which an auxiliary electrode is configured by a metal nano ink which has a good reflectance and scatters light to reflect and scatter light, which is output from the organic light emitting diode to be reflected from an interface of a substrate and an external air layer, again to improve a light extraction efficiency.

In addition, the present disclosure are not limited to the above-mentioned objects, and other objects, which are not mentioned above, can be clearly understood by those skilled in the art from the following descriptions.

In the lighting apparatus according to an exemplary aspect of the present disclosure, an auxiliary electrode which divides a plurality of pixels and transmits a signal to a first substrate is configured by a metal nano ink so that the light, which is reflected from the interface of the first substrate and the external air layer to be incident, is reflected and scattered again, thereby improving the luminous efficiency of the lighting apparatus.

In another aspect of the present disclosure, an organic light emitting device includes a plurality of pixels defined at first and second substrates; a light extraction enhancing pattern disposed on the first substrate and defining the plurality of pixels and an eletrcial signal applied to the plurality of pixels through the light extraction enhancing pattern; and an organic light emitting diode disposed in each pixel of the first substrate and including a first electrode, an organic light emitting layer, and a second electrode, wherein the light extraction enhancing patterns improves light extraction by repeating reflecting and scattering light emitted from the organic light emitting diode at an interface between the first substrate and an external air layer.

The plurality of pixels of the first substrate is divided by the auxiliary electrode connected to a first electrode. The auxiliary electrode is disposed to have a matrix type with a set width, a mesh type, octagonal, hexagonal, or circular shapes.

The metal nano ink may be configured by ink and metal nanoparticles dispersed in the ink and the metal nanoparticles include at least one metal selected from one group consisting of gold, silver, platinum, copper, nickel, iron, cobalt, zinc, chrome, and manganese.

The lighting apparatus may further include a light extracting layer disposed between the first electrode and the first substrate and a connection pattern which is located between the auxiliary electrode and the first electrode to electrically connect the auxiliary electrode and the first electrode and apply a resistance value with a predetermined magnitude may be disposed in each pixel.

Other detailed matters of the aspects are included in the detailed description and the drawings.

According to the present disclosure, an auxiliary electrodes which transmits a signal to a first electrode is configured by a metal nano ink containing metal nanoparticles to reflect and scatter light, which is reflected from the interface of the first substrate and the external air layer, again, to minimize light loss between the first substrate and the external air layer, thereby improving an optical efficiency and a power efficiency of the lighting apparatus.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
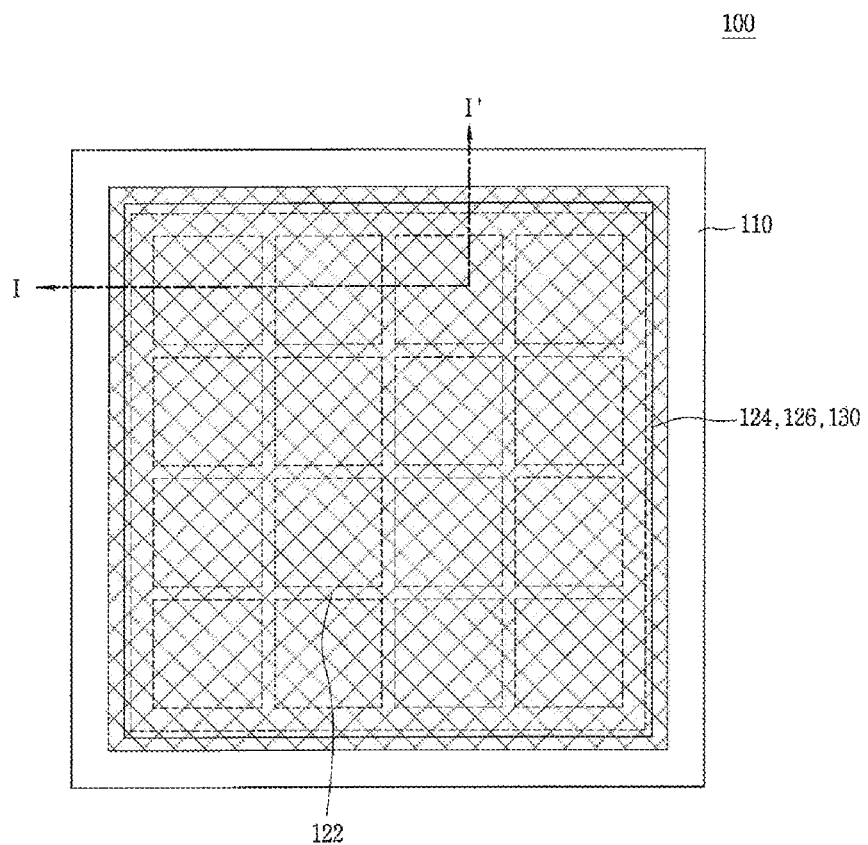
FIG. 1 is a plan view illustrating a structure of a lighting apparatus according to a first exemplary aspect of the present disclosure.

Hereinafter, the present disclosure will be described in detail with reference to the accompanying drawings.

In the present disclosure, provided is a lighting apparatus including an organic light emitting diode formed of an organic material, rather than a lighting apparatus including an inorganic light emitting diode formed of an inorganic material.

The organic light emitting diode formed of an organic light emitting material has relatively excellent luminous efficiencies of red and green light as compared with an inorganic light emitting diode. Further, widths of emission peaks of blue, red, and green light of the organic light emitting diode are relatively broader than that of the inorganic light emitting diode so that a color rendering property is improved. Therefore, there is an advantage in that light of the lighting apparatus is more similar to the sunlight.

Specifically, the present disclosure provides a lighting apparatus which may improve the luminous efficiency and the power efficiency.

Generally, the luminous efficiency of the lighting apparatus is lowered because a plurality of layers having different refractive indexes is provided in the lighting apparatus and light emitted from a light emitting layer is refracted and reflected while passing through the plurality of layers so that light loss is caused. Such light loss is mainly caused by refraction and reflection between an organic light emitting layer which actually emits light and an electrode, refraction and reflection between an electrode and a substrate, and refraction and reflection between a substrate and an external air layer.

Therefore, the best method for improving the luminous efficiency of the lighting apparatus is to dispose separate light extracting layers on an interface between an organic light emitting layer and an electrode, an interface between the electrode and the substrate, and/or an interface between the substrate and the external air layer to change a refractive index between the organic light emitting layer and the substrate and a refractive index between the substrate and the external air layer, thereby minimizing reflection of light between the organic light emitting layer and the substrate and between the substrate and the external air layer and changing refraction therebetween.

However, when the above-described light extracting layer is provided between the electrode and the substrate (generally, such a light extracting layer is referred to as an internal light extracting layer), a process for forming a separate layer is added. Therefore, there are problems in that a manufacturing process of a lighting apparatus becomes complex, a manufacturing cost is increased, and a thickness of the lighting apparatus is increased.

Further, nanoparticles are dispersed in the internal light extracting layer to scatter the input light, thereby improving a light extraction efficiency. However, the nanoparticles absorb moisture generated during a wet etching process which is a process after forming an internal light extracting layer. As a result, the moisture penetrates into the organic light emitting layer to cause a failure of the lighting apparatus including the internal light extracting layer. However, in the present disclosure, a separate internal light extracting layer is not provided so that the failure due to the moisture penetration may be avoided.

In the present disclosure, the optical efficiency of the lighting apparatus may be improved without forming a separate light extracting layer. A separate light extracting layer is not necessary so that in the lighting apparatus of the present disclosure, the increase of the manufacturing cost due to the addition of the manufacturing process is suppressed and the increased thickness and the failure of the organic light emitting layer due to moisture penetration are suppressed.

FIG. 1 is a view illustrating a structure of a lighting apparatus using an organic light emitting diode according to a first exemplary aspect of the present disclosure.

As illustrated in FIG. 1, a lighting apparatus 100 according to a first exemplary aspect of the present disclosure is a surface emission lighting apparatus and a first electrode 124 and a second electrode 126 are disposed over the entire surface of a first substrate 110 and an organic light emitting layer 130 is disposed between the first electrode 124 and the second electrode 126 to form an organic light emitting diode. In the lighting apparatus 100 having the above-described structure, a signal is applied to the first electrode 124 and the second electrode 126 of the organic light emitting diode to cause the organic light emitting layer 130 to emit light so that light is output from the entire substrate 110.

An auxiliary electrode 122 is disposed on the first substrate 110 in a matrix. The auxiliary electrode 122 is configured by a metal having a good conductivity to apply a uniform voltage to the first electrode 124 disposed in the entire area of the first substrate 110 so that a large size lighting apparatus 100 may emit light with uniform luminance.

The organic light emitting layer 130 is configured by an organic light emitting material which outputs white light. For example, the organic light emitting layer 130 may be configured by a blue organic light emitting layer, a red organic light emitting layer, and a green organic light emitting layer or may be configured by a tandem structure including a blue light emitting layer and a yellow-green light emitting layer. However, the organic light emitting layer 130 of the present disclosure is not limited to the above-described structure and various structures may be applied therefor.

Further, the organic light emitting layer 130 of the present disclosure may further include an electron injection layer and a hole injection layer which inject electrons and holes to the organic light emitting layer 130, respectively and an electron transport layer and a hole transport layer which transport the injected electrons and holes to the organic light emitting layer, respectively, and a charge generating layer which generates charges such as electrons and holes.

Even though not illustrated in the drawing, a first pad and a second pad which are connected to the first electrode 124 and the second electrode 126, respectively, to be applied with a voltage from the outside are disposed on the first substrate 110. In this case, the first pad and the second pad may be formed at one edge of the first substrate 110 or may be formed at both edges, respectively. Further, a plurality of first pads and second pads may be provided to be disposed at four edges of the first substrate 110.

Figure 2:
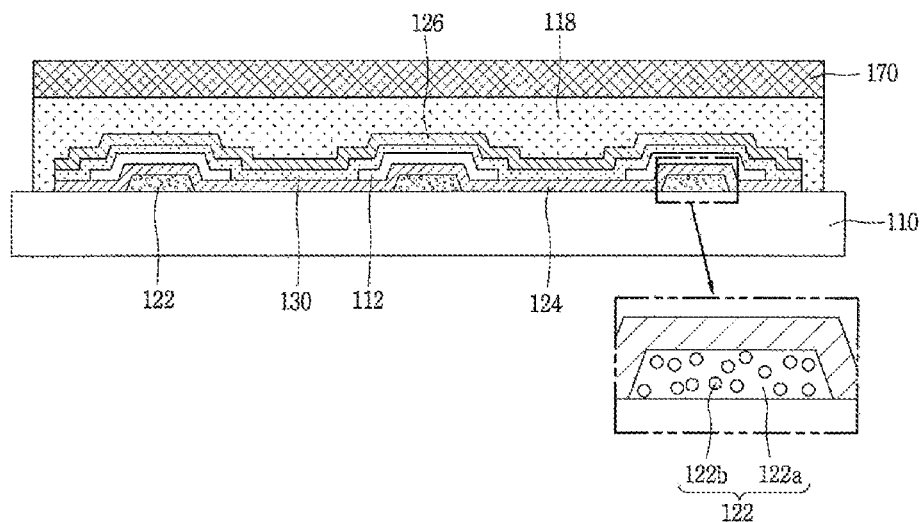
FIG. 2 is a cross-sectional view taken along line I-I' of FIG. 1.

FIG. 2 is a cross-sectional view taken along line I-I' of FIG. 1 and the lighting apparatus 100 according to the first exemplary aspect of the present disclosure will be described in more detail with reference to FIG. 2.

As illustrated in FIG. 2, the first electrode 124 is disposed on the first substrate 110 which is formed of a bendable transparent material having flexibility such as plastic and a rigid transparent material such as glass. The first electrode 124 may be configured by a transparent metal oxide such as indium tin oxide (ITO) or indium zinc oxide (IZO).

Even though not illustrated in the drawing, the first pad and the second pad may be disposed at the edge area of the first substrate 110. In this case, the first pad and the second pad may be formed of the same material as the first electrode 124 by the same process.

The auxiliary electrode 122 is disposed on the first substrate 110 to be electrically connected to the first electrode 124. The first electrode 124 is formed of a transparent conductive material to have an advantage in that the emitted light may pass through the first electrode, but also have a disadvantage in that an electric resistance is very high as compared with metal. Therefore, when a large size lighting apparatus 100 is manufactured, the distribution of the current applied to a large lighting area is not uniform due to a high resistance of the transparent conductive material and the large size lighting apparatus 100 may not emit light with uniform luminance due to the current distribution which is not uniform.

The auxiliary electrode 122 is disposed over the entire first substrate 110 to have a matrix type with a small thickness, a mesh type, a hexagonal or an octagonal, or a circular shape to allow a uniform voltage to be applied to the first electrode 124 of the entire first substrate 110. Therefore, the light with a uniform luminance may be emitted from the large size lighting apparatus 100. Although the auxiliary electrode 122 is disposed below the first electrode 124 in the drawing, the auxiliary electrode 122 may be disposed above the first electrode 124.

The auxiliary electrode 122 is disposed in a matrix to divide the first substrate 110 into a plurality of pixel units. That is, the auxiliary electrode 122 has a very low resistance as compared with the first electrode 124 so that substantially, the voltage of the first electrode 124 is not directly applied to the first electrode 124 through the first pad, but is applied through the auxiliary electrode 122. Therefore, even though the first electrode 124 is formed over the entire first substrate 110, the first electrode 124 is divided into a plurality of pixels by the auxiliary electrode 122.

In the present disclosure, the auxiliary electrode 122 is formed to have a width of approximately 2 to 60 μm, but the auxiliary electrode 122 may be determined by various factors such as a type of metal to be used, an area of the lighting apparatus 100, or a size of the pixel.

The auxiliary electrode 122 transmits the signal to the first electrode 124 in the pixel so that a conductive material having a resistance which is lower than that of ITO or IZO which forms the first electrode 124 needs to be used for the auxiliary electrode 122. For example, metal may be used for the auxiliary electrode 122, but in the present disclosure, instead of metal, metal nano ink is used.

Figure 3:
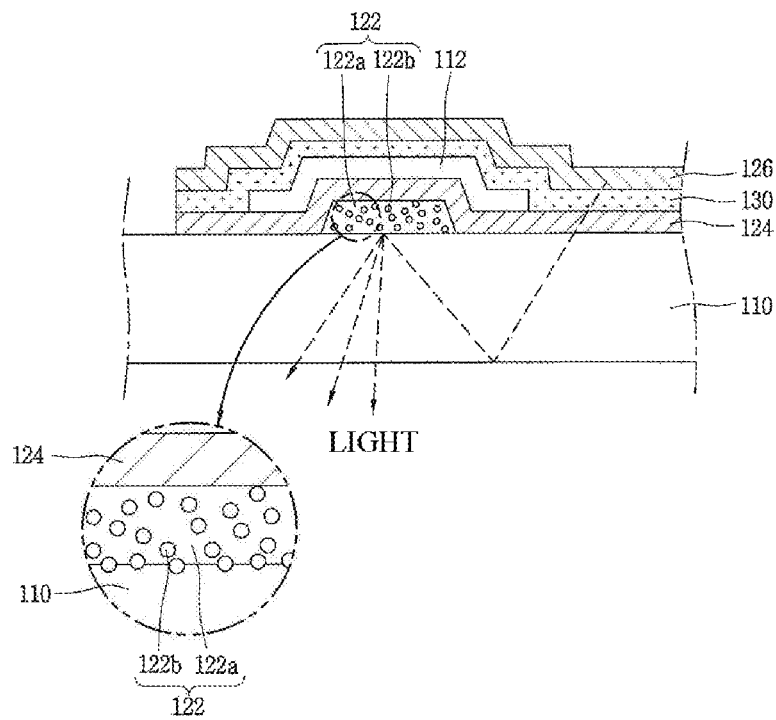
FIG. 3 is a view illustrating light which is reflected and scattered by an auxiliary electrode.

FIG. 3 is a view illustrating an auxiliary electrode 122 of the present disclosure. As illustrated in FIG. 3, the auxiliary electrode 122 is configured by metal nano ink and the metal nano ink is configured by ink 122a and metal nanoparticles 122b dispersed in the ink 122a.

Alcohol based ink including terpineol, ethyl alcohol, methyl alcohol, isopropyl alcohol, 2-methoxy ethanol, propyl alcohol, pentyl alcohol, hexyl alcohol, butyl alcohol, or octyl alcohol, glycol based ink including ethylene glycol, diethylene glycol, triethylene glycol, poly-ethylene glycol, propylene glycol, dipropylene glycol, hexylene glycol, triethylene glycol monomethyl ether (TGME), or propylene glycol methyl ether acetate, alkyl based ink including glycerin, acetone, formamide, methyl ethyl ketone, methane, ethane, propane, butane, pentane, hexane, heptane, octane, nonan, decane, undecane, or dodecane, and cyclohexanone may be used for the ink 122a.

Further, gold, silver, platinum, copper, nickel, iron, cobalt, zinc, chrome, or manganese may be used for the metal nanoparticle 122b.

As described above, the metal nano ink configured by the ink 122a in which the metal nanoparticles 122b are dispersed has a better reflectance than the metal. Therefore, as illustrated in the drawing, light which is emitted from the organic light emitting layer 130 to be reflected from the interface between the first substrate 110 and the external air layer to be incident onto a lower surface of the auxiliary electrode 122 is reflected onto the first substrate 110 by the auxiliary electrode 122 again.

Since the metal nanoparticles 122b are dispersed in the auxiliary electrode 122, a lower portion of the auxiliary electrode 122 has a predetermined illumination by the metal nanoparticles 122b and the light which is incident onto the auxiliary electrode 122 is scattered and reflected due to the illumination.

A protective layer 112 is laminated above the first electrode 124 of the first substrate 110. The protective layer 112 is configured to cover the auxiliary electrode 122 and the first electrode 124 above the auxiliary electrode 122. Since the auxiliary electrode 122 is configured by an opaque metal, the light is not output to an area where the auxiliary electrode 122 is formed. Therefore, the protective layer 112 is provided only above the auxiliary electrode 122 and is not disposed in an actual emission area (that is, a pixel) so that the light is emitted only from the emission area of the pixel to be output.

Further, the protective layer 112 is formed to enclose the auxiliary electrode 122 to reduce a step caused by the auxiliary electrode 122 so that various layers formed thereafter are stably formed without being disconnected.

The protective layer 112 is configured by an inorganic layer such as SiOx and SiNx. However, the protective layer 112 may be configured by an organic layer such as photoacryl and also configured by a plurality of layers of inorganic layers and organic layers.

The organic light emitting layer 130 and the second electrode 126 are disposed above the first electrode 124 and the protective layer 112.

The organic light emitting layer 130 is a white light emitting layer and may be configured by a red light emitting layer, a blue light emitting layer, and a green light emitting layer or may be configured by a tandem structure including a blue light emitting layer and a yellow-green light emitting layer. Further, the organic light emitting layer 130 may further include an electron injection layer and a hole injection layer which inject electrons and holes to the organic light emitting layer, respectively and an electron transport layer and a hole transport layer which transport the injected electrons and holes to the organic light emitting layer, respectively, and a charge generating layer which generates charges such as electrons and holes.

A material which receives holes and electrons from the hole transport layer and the electron transport layer to couple the holes and electrons to emit light in a visible light region and has a good quantum efficiency for fluorescence or phosphorescence is desirable for the organic light emitting layer 130. Examples of such an organic material may include 8-hydroxy-quinoline aluminum complex (Alq3), carbazole based compounds, a dimerized styryl compound, BAlq, 10-hydroxybenzoquinoline-metal compound, benzoxazole, benzothiazole, and benzimidazole-based compounds, and poly (p-phenylenevinylene) (PPV), but are not limited thereto.

Further, the second electrode 126 may be configured by metal such as Ca, Ba, Mg, Al, and Ag or an alloy thereof. Even though not illustrated in the drawing, a second pad which is connected to the second electrode 126 to apply a voltage to the second electrode 126 is provided above an outer edge of the first substrate 110.

The first electrode 124, the organic light emitting layer 130, and the second electrode 126 configure the organic light emitting diode. In this case, the first electrode 124 serves as an anode of the organic light emitting diode and the second electrode 126 serves as a cathode. When the voltage is applied to the first electrode 124 and the second electrode 126, the electrons from the second electrode 126 are injected into the organic light emitting layer 130 and the holes from the first electrode 124 are injected into the organic light emitting layer 130. Thereafter, excitons are generated in the organic light emitting layer 130. As the excitons are decayed, light corresponding an energy difference of a lowest unoccupied molecular orbital (LUMO) and a highest occupied molecular orbital (HOMO) of the light emitting layer is generated to be radiated in a lower direction (toward the substrate 110 in the drawing).

The protective layer 112 is disposed above the auxiliary electrode 122 so that the organic light emitting layer 130 above the auxiliary electrode 122 is not in direct contact with the first electrode 124. Therefore, the organic light emitting diode is not formed above the auxiliary electrode 122. In other words, the organic light emitting diode in an illuminating unit EA is formed only in a pixel between auxiliary electrodes 122 formed in a matrix.

An adhesive agent 118 is applied on the first substrate 110 equipped with the organic light emitting diode and a second substrate 170 is disposed thereon so that the second substrate 170 is attached by the adhesive agent 118. By doing this, the lighting apparatus 100 is sealed. The adhesive agent 118 may use a photo-curing adhesive or a thermosetting adhesive. The second substrate 170 may be configured by various materials. As illustrated in the drawing, the adhesive agent 118 is also provided on the side of the organic light emitting diode to completely seal the organic light emitting diode.

The second substrate 170 is provided to suppress moisture or air from permeating from the outside, so that any material which performs the above-mentioned function may be used. For example, the second substrate 170 may be configured by polymer such as polyethyleneterephtalate (PET) and a thin metal foil such as aluminum.

Further, even though not illustrated in the drawing, a protective layer configured by an organic layer and/or inorganic layer and an encapsulating agent configured by an epoxy compound, an acrylate compound, or an acrylic compound may be provided on the second electrode 126 and on the side of the organic light emitting diode.

In the lighting apparatus having the structure as described above, when a signal is input, the signal is transmitted to the first electrode 124 of each pixel through the auxiliary electrode 122 to apply the current between the first electrode 124 and the second electrode 126. By doing this, the organic light emitting layer 130 emits light. The light emitted from the organic light emitting layer 130 is downwardly output via the first electrode 124 and the first substrate 110. Light scattering particles 125 are dispersed in the first electrode 124 to scatter light which is emitted from the organic light emitting layer 130 to transmit.

Generally, the light emitted from the organic light emitting layer 130 does not pass through the interface, but is reflected due to a difference between refractive indexes of layers adjacent to the interface between the first electrode and the first substrate and the interface between the first substrate and the external air layer. The reflected light is guided into the first electrode 124 and the first substrate 110 to be propagated to side surfaces of the first electrode 124 and the first substrate 110. Normally, about 80% of light emitted from the organic light emitting layer 130 is reflected from the interface of the layers and just 20% thereof is output to the outside.

In order to suppress the lowering of luminous efficiency by the reflection from the interface, the light extracting layer may be included in the lighting apparatus 100. The light extracting layer reduces the difference between refractive indexes of layers adjacent to the interface to reduce an incident angle at which light is totally reflected. By doing this, the reflection from the interface may be reduced.

The light is mainly reflected from the interface between the first electrode and the first substrate in the lighting apparatus 100 and/or the interface between the first substrate and the external air layer. Therefore, the light extracting layer may be mainly formed at the interface between the first electrode and the first substrate (internal light extracting layer) or the interface between the first substrate 110 and the external air layer, that is, an external surface of the first substrate 110 (external light extracting layer).

However, when the light extracting layer is provided in the lighting apparatus 100, a process of forming the light extracting layer is added so that there may be a problem in that the manufacturing process becomes complex, the manufacturing cost is increased, and a thickness of the lighting apparatus is increased.

Therefore, in the present disclosure, the luminous efficiency of the lighting apparatus 100 may be improved by forming the auxiliary electrode 122 with a material having a good reflectance and a good scattering characteristic on a reflecting surface, instead of forming a separate light extracting layer.

As illustrated in FIG. 3, the auxiliary electrode 122 simultaneously reflects and scatters light reflected from the interface between the first substrate 110 and the external air layer to output the reflected light to the outside, to improve the luminous efficiency of the lighting apparatus 100. In this regard, since the auxiliary electrode 122 suppresses the lowering of the luminous efficiency by the reflection from the interface between the first substrate 110 and the external air layer, the auxiliary electrode 122 serves as an external light extracting layer which is formed on an outer edge surface of the first substrate 110.

However, not all light reflected from the interface between the first substrate 110 and the external air layer is reflected again by the auxiliary electrode 122 according to the present disclosure to be output from the lighting apparatus 100, but only some light (light incident onto a lower surface of the auxiliary electrode 122) is reflected. However, in the present disclosure, some of light reflected from the interface between the first substrate 110 and the external air layer is reflected without using a separate light extracting layer so that the luminous efficiency of the lighting apparatus 100 may be improved without changing a structure of the lighting apparatus 100.

Hereinafter, a manufacturing method of a lighting apparatus 100 according to a first exemplary aspect of the present disclosure will be described in detail with reference to the accompanying drawings.

FIGS. 4A to 4D and FIGS. 5A to 5D are views illustrating a manufacturing method of a lighting apparatus 100 according to the present disclosure in which FIGS. 4A to 4D are plan views and FIGS. 5A to 5D are cross-sectional views.

Figure 4A:
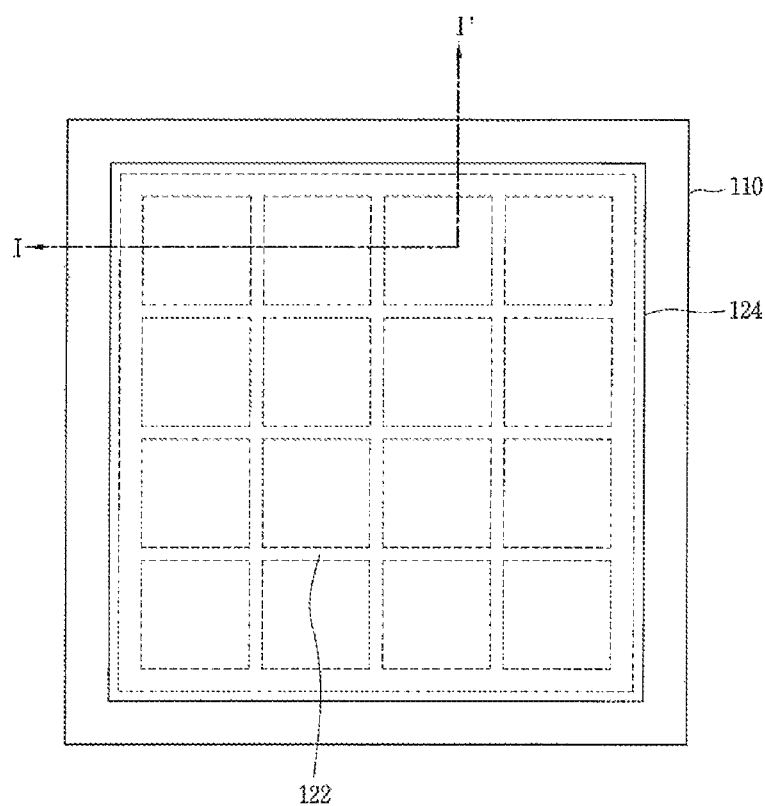
FIGS. 4A to 4D are plan views illustrating a manufacturing method of a lighting apparatus according to the present disclosure.
Figure 5A:
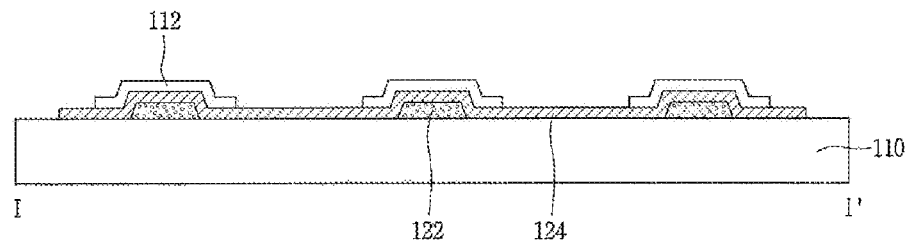
FIGS. 5A to 5D are cross-sectional views illustrating a manufacturing method of a lighting apparatus according to the present disclosure.

First, as illustrated in FIGS. 4A and 5A, a transparent first substrate 110 which is formed of a material having flexibility such as plastic and a rigid material such as glass is prepared.

Next, metal nanoparticles are mixed to ink to form metal nano ink. In this case, alcohol based ink including terpineol, ethyl alcohol, methyl alcohol, isopropyl alcohol, 2-methoxy ethanol, propyl alcohol, pentyl alcohol, hexyl alcohol, butyl alcohol, or octyl alcohol, glycol based ink including ethylene glycol, diethylene glycol, triethylene glycol, poly-ethylene glycol, propylene glycol, dipropylene glycol, hexylene glycol, triethylene glycol monomethyl ether (TGME), or propylene glycol methyl ether acetate, alkyl based ink including glycerin, acetone, formamide, methyl ethyl ketone, methane, ethane, propane, butane, pentane, hexane, heptane, octane, nonan, decane, undecane, or dodecane, and cyclohexanone may be used for the ink. Further, gold, silver, platinum, copper, nickel, iron, cobalt, zinc, chrome, or manganese may be used for the metal nanoparticle.

Thereafter, after applying the metal nano ink using an inkjet method or a screen printing method, the metal nano ink is burned by heating the applied metal nano ink to form the auxiliary electrode 122 on the first substrate 110.

The auxiliary electrode 122 is disposed in a matrix in a horizontal direction and a vertical direction to have a strip shape set over the entire first substrate 110, but the auxiliary electrode 122 may be formed to have a mesh type, a hexagonal, an octagonal, or a circular shape. The auxiliary electrode 122 may be formed to have a width of approximately 45 to 55 μm. However, the auxiliary electrode 122 is not limited to have a specific width, but the auxiliary electrode may be formed to have various widths depending on an area of the lighting apparatus, a size of the pixel, and a material of the auxiliary electrode 122.

Further, the metal nanoparticles 122b included in the auxiliary electrode 122 is uniformly dispersed over the entire auxiliary electrode 122 and a density of the metal nanoparticles 122b is determined depending on the thickness and the width of the auxiliary electrode 122.

Next, the first electrode 124 is formed by laminating and etching transparent metal oxide such as indium tin oxide (ITO) and indium zinc oxide (IZO) on the first substrate 110.

In the meantime, in the above description, the first electrode 124 may be formed over the entire first substrate 110 including an upper surface of the auxiliary electrode 122 after forming the auxiliary electrode 122 or the auxiliary electrode 122 may be formed on the first electrode 124 after forming the first electrode 124 first.

Thereafter, an inorganic insulating material or an organic insulating material is laminated on the first electrode 124 and then etched to form the protective layer 112 on the first electrode 124 above the auxiliary electrode 122. In this case, the protective layer 112 may be configured by a single layer of an inorganic insulating layer or an organic insulating layer or may be configured by a plurality of layers of inorganic insulating layers and organic insulating layers.

Figure 4B:
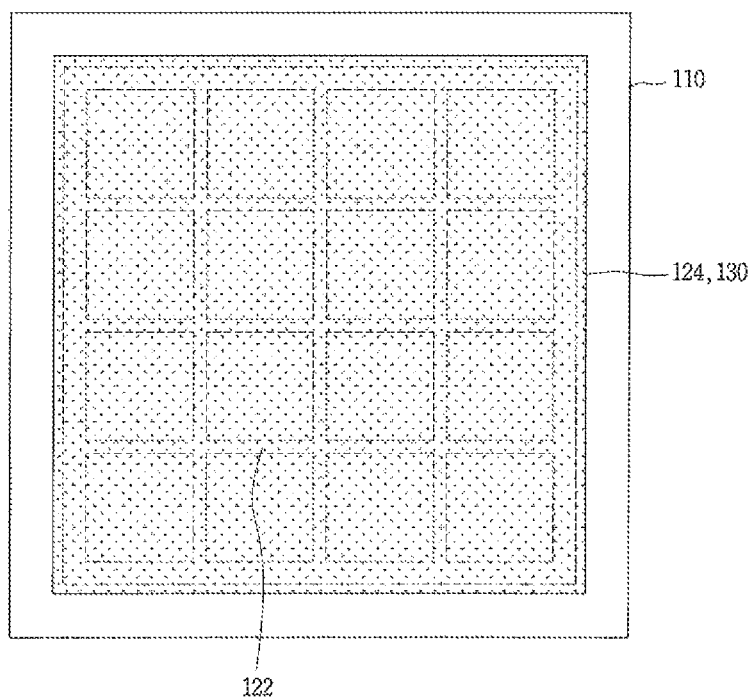
Figure 5B:
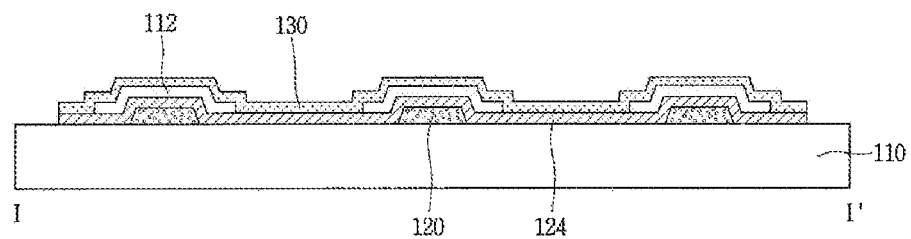

Next, as illustrated in FIGS. 4B and 5B, the organic light emitting layer 130 is formed by depositing an organic light emitting material above the first substrate 110. In this case, the organic light emitting layer 130 may be formed by depositing the organic light emitting material after disposing a mask on a mother substrate on which a plurality of lighting apparatuses is formed.

Figure 4C:
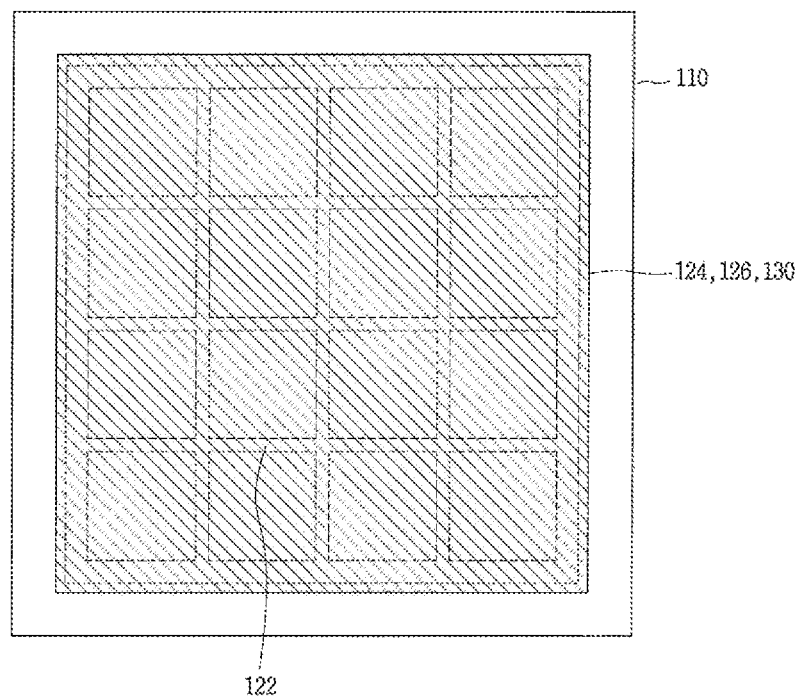
Figure 5C:
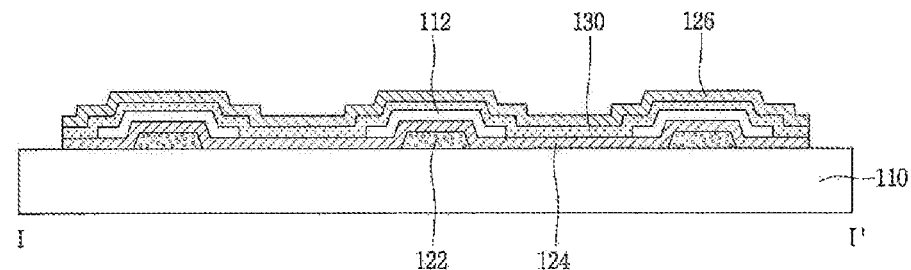

Next, as illustrated in FIGS. 4C and 5C, the second electrode 126 is formed by depositing and etching metal such as Ca, Ba, Mg, Al, and Ag above the organic light emitting layer 130.

Figure 4D:
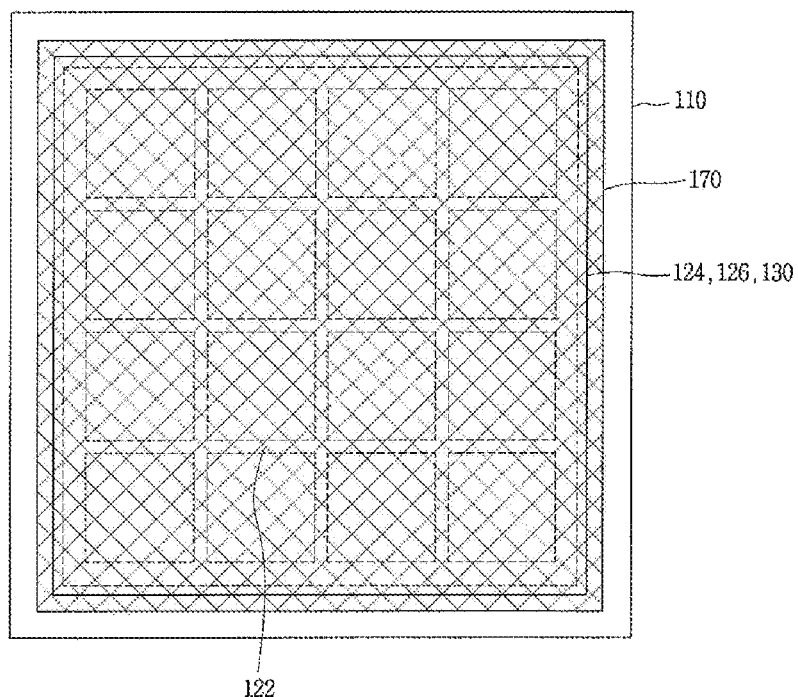
Figure 5D:
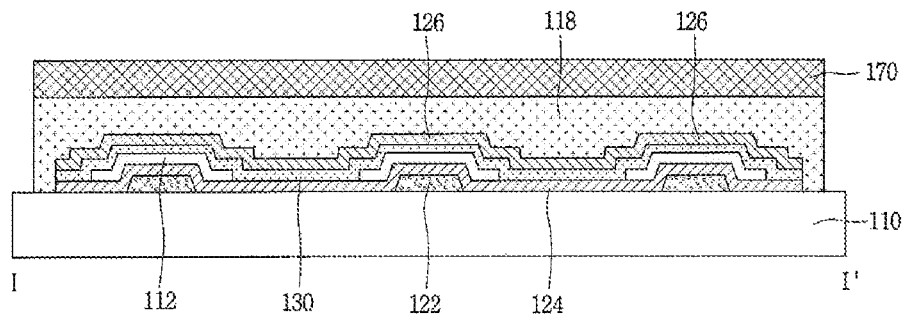

Thereafter, as illustrated in FIGS. 4D and 5D, an adhesive agent 118 formed of a photo-curing adhesive material or a thermosetting adhesive material is applied on the first substrate 110, the second substrate 170 is positioned thereon, and then the adhesive agent 118 is hardened to attach the second substrate 170. Thereafter, the bonded first substrate 110 and second substrate 170 are cut to separate completed lighting apparatuses 100 and complete individual lighting apparatuses 100. A polymer film such as PET, a thin metal foil, and glass may be used for the second substrate 170.

As described above, in the present disclosure, the auxiliary electrode 122 is configured by metal nano ink which reflects and scatters the light so that the luminous efficiency of the lighting apparatus 100 may be improved without separately changing a structure.

Figure 6:
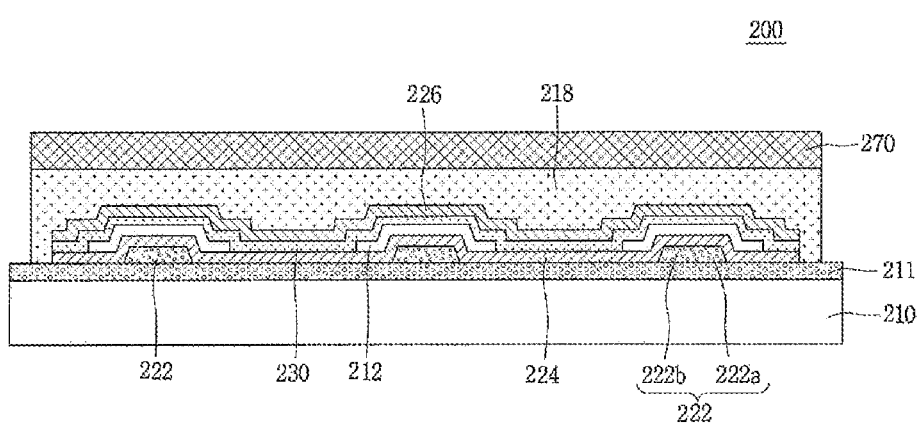
FIG. 6 is a cross-sectional view illustrating a structure of a lighting apparatus according to a second exemplary aspect of the present disclosure.

FIG. 6 is a plan view illustrating a structure of a lighting apparatus 200 according to a second exemplary aspect of the present disclosure.

The lighting apparatus 200 of the second exemplary aspect has the similar structure to the lighting apparatus 100 of the first exemplary aspect illustrated in FIG. 2, so that description for the same structure will be omitted or briefly described and only the different structure may be described in detail.

As illustrated in FIG. 6, in a lighting apparatus 200 with this structure, an auxiliary electrode 222 is formed on a first substrate 210. In this case, the auxiliary electrode 222 is configured by metal nano ink which has a good reflectance and scatters the reflected light to reflect the light reflected from an interface between the first substrate 210 and an external air layer. Therefore, the luminous efficiency of the lighting apparatus 200 is improved. That is, the auxiliary electrode 222 not only serves to apply a signal to the first electrode 224, but also serves as an external light extracting layer to improve the luminous efficiency of the lighting apparatus 200.

A light extracting layer 211 is disposed between the first electrode 224 and the first substrate 210. The light extracting layer 211 reduces light reflection from the interface between the first electrode 224 and the first substrate 210 by reducing a refractive index between the first electrode 224 and the first substrate 210 to efficiently extract light emitted from the organic light emitting layer 230 to the outside.

A refractive index of ITO or IZO which forms the first electrode 224 is approximately 1.8 and a refractive index of glass which forms the first substrate 210 is approximately 1.5. Therefore, there is a difference between refractive indexes of the first electrode 224 and the first substrate 210 and some of light incident onto the interface of the first electrode 224 and the first substrate 210 is totally reflected.

The light extracting layer 211 may be configured to have various shapes. For example, the light extracting layer 211 may be configured by polycarbonate having periodical recessed portions and protrusions with a nano-structure and is configured by a material having a refractive index which is lower than that of glass to reduce the difference of refractive indexes between the first electrode 224 and the first substrate 210. Further, the light extracting layer 211 is configured by a resin based layer in which metal nanoparticles are dispersed to scatter input light. Therefore, the light reflection from the interface between the first electrode 224 and the first substrate 210 is minimized to improve a light extraction efficiency.

However, the light extracting layer 211 of the present disclosure is not limited to the above-described structure and any material which may minimize the light reflection due to the refractive index difference between two layers may be used for the light extracting layer 211. Even though not illustrated in the drawing, a buffer layer which is configured by at least one layer may be provided on an upper surface and/or lower surface of the light extracting layer 211.

As described above, in the exemplary aspect, the auxiliary electrode 222 is formed of metal nano ink which has a good reflectance and a good scattering characteristic and a separate light extracting layer 211 is also provided. Therefore, the light extraction efficiency may be maximized by minimizing the light reflection from the interface between the first substrate 210 and the external air layer and the interface between the first electrode 224 and the first substrate 210.

Figure 7A:
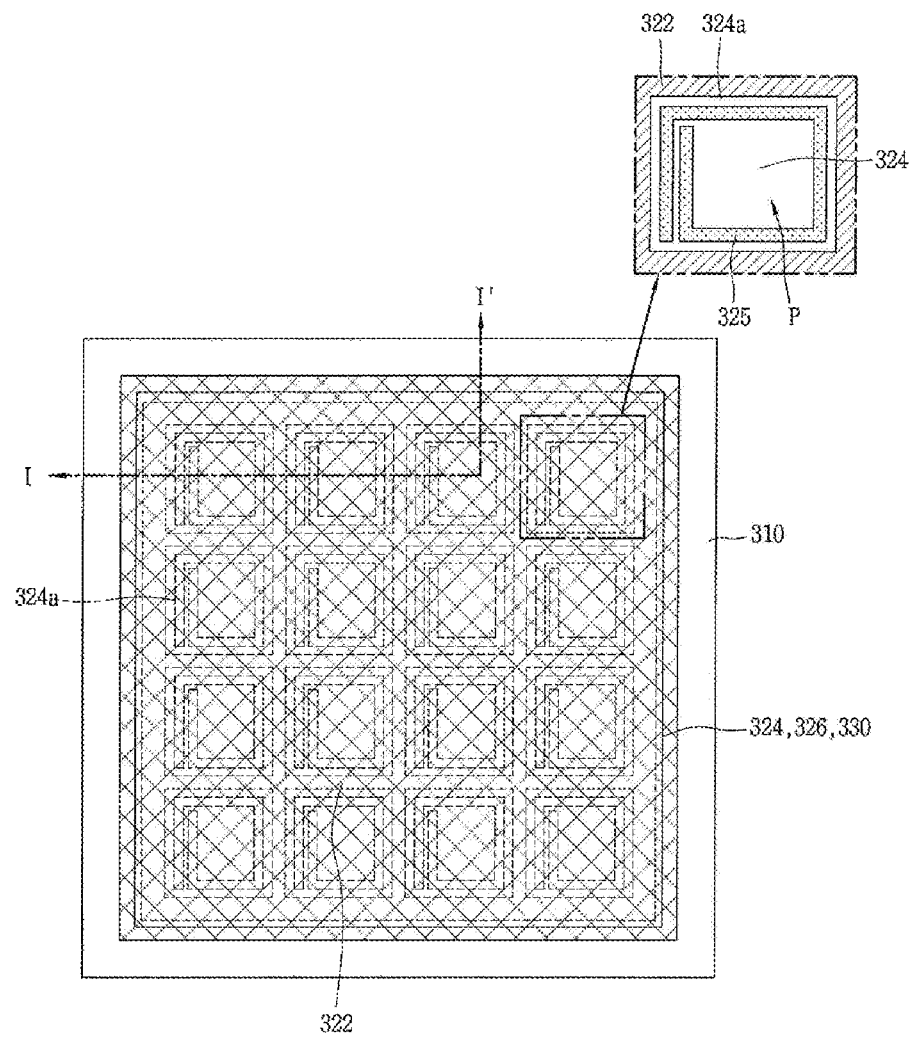
FIGS. 7A and 7B are a plan view and a cross-sectional view illustrating a structure of a lighting apparatus according to a third exemplary aspect of the present disclosure, respectively.
Figure 7B:
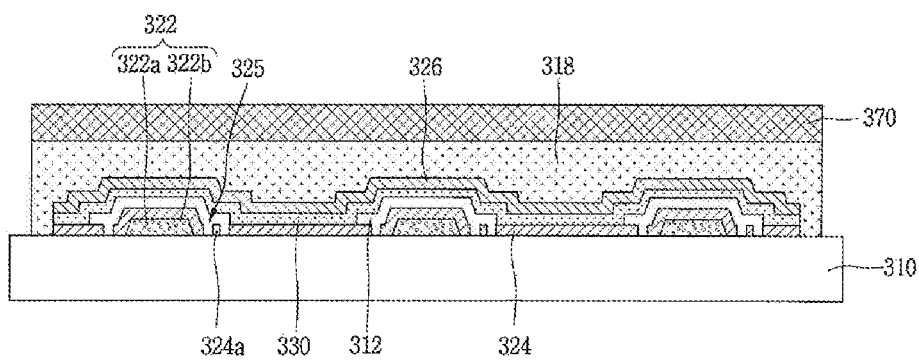

FIGS. 7A and 7B are views illustrating a structure of a lighting apparatus 300 according to a third exemplary aspect of the present disclosure. The lighting apparatus 300 of the third exemplary aspect has the similar structure to the lighting apparatus 100 of the first exemplary aspect, so that description for the same structure will be omitted or briefly described and only the different structure may be described in detail.

As illustrated in FIGS. 7A and 7B, an auxiliary electrode 322 is formed on a first substrate 310. In this case, the auxiliary electrode 322 is configured by metal nano ink prepared by mixing metal nanoparticles in the ink so that the light reflected from an interface between the first substrate 310 and an external air layer is reflected again and scattered to improve the light extraction efficiency of light which is output to the outside.

In a pixel P divided by the auxiliary electrode 322, a first electrode 324 is formed to be spaced apart from the auxiliary electrode 322 with a predetermined distance and the auxiliary electrode 322 and the first electrode 324 are electrically connected to each other by a conductive pattern 324a having a relatively high resistance.

In the lighting apparatus 300 with the above-described structure, the conductive pattern 324a is formed between the auxiliary electrode 322 and the first electrode 324 so that a signal applied to the auxiliary electrode 322 is applied to the first electrode 324 via the conductive pattern 324a. In this case, the conductive pattern 324a is formed to be sufficiently long (that is, a path through which the signal flows is sufficiently long), to form separate short-circuit reduction resistances RSR1, RSR2, . . . , RSRn. The short-circuit reduction resistances RSR1, RSR2, . . . , RSRn are formed for the following reason.

Figure 8A:
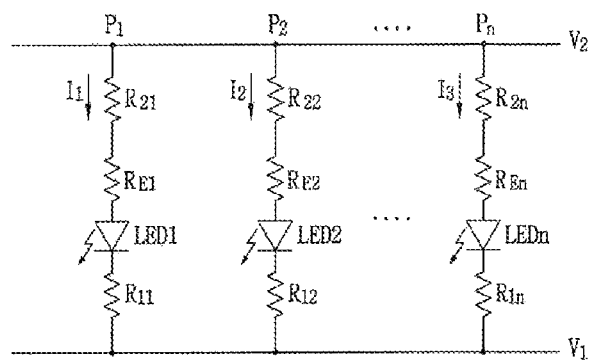
FIG. 8A is a view schematically illustrating a circuit of an organic light emitting diode provided in a lighting apparatus.

FIG. 8A is a view schematically illustrating a circuit of an organic light emitting diode provided in a lighting apparatus. As illustrated in FIG. 8A, voltages V1 and V2 are applied to the first electrode 324 and the second electrode 326, respectively and resistors RE1, RE2, . . . , REn of the organic light emitting layer 330, resistors R11, R12, . . . , R1n of the first electrode 324, and resistors R21, R22, . . . , R2n of the second electrode 326 are connected in series between the first electrode 324 and the second electrode 326.

An organic light emitting diode provided in the lighting apparatus includes a plurality of pixels P1, P2, . . . , Pn and the pixels are connected in parallel with other pixels.

In the organic light emitting diode with the above-described structure, the plurality of pixels is connected in parallel to apply voltages V1 and V2 to the first electrode 324 and the second electrode 326, respectively. Therefore, currents I1, I2, . . . , In are applied to organic light emitting layers LED1, LED2, . . . , LEDn of the pixels P1, P2, . . . , Pn so that the organic light emitting layers LED1, LED2, . . . , LEDn emit light. In this case, a voltage V1 having a predetermined magnitude is applied to the first electrode 324 and the second electrode 326 may be grounded.

Approximately same resistance is formed in the plurality of pixels (even though the resistance may vary depending on a thickness error of the electrodes 324 and 326 and the organic light emitting layer 330 formed in each pixel P1, P2, . . . , Pn, the difference is insignificant). Therefore, light with approximately same luminance is emitted in the plurality of pixels so that uniform light is output for the entire lighting apparatus.

In the meantime, the organic light emitting layer 330 of the organic light emitting diode is formed to have a thin thickness of several hundred Å. Therefore, when foreign materials penetrate into the organic light emitting layer 330 due to a process failure, a pin hole or a crack is generated in the organic light emitting layer 330. Therefore, the first electrode 324 and the second electrode 326 are in contact with each other through the organic light emitting layer 330, which may cause a short-circuit. Further, in the case of the lighting apparatus, various metal layers and insulating layers are formed below the organic light emitting layer 330. In this case, the organic light emitting layer 330 is cracked due to a step of the metal layer and the insulating layer so that the first electrode 324 and the second electrode 326 may be in contact with each other. Further, since the organic light emitting material is non-uniformly applied due to a process failure or a process error during the laminating process of the organic light emitting layer 330, the first electrode 324 and the second electrode 326 may be electrically connected to each other.

Figure 8B:
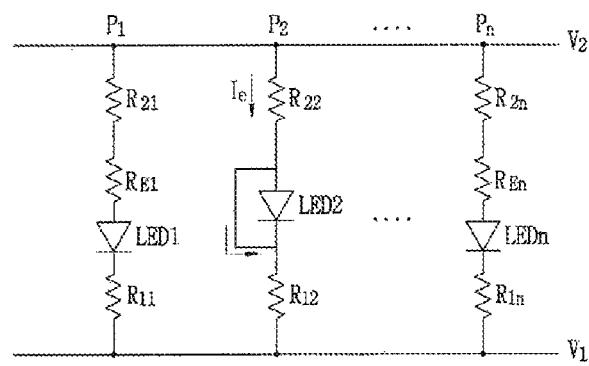
FIG. 8B is a view illustrating a circuit of an organic light emitting diode when an electric short-circuit is generated in a first electrode and a second electrode.

FIG. 8B is a view illustrating a circuit of an organic light emitting diode when an electric short-circuit can be caused in the first electrode 324 and the second electrode 326.

As illustrated in FIG. 8B, in one pixel P2 among the plurality of pixels P1, P2, . . . , Pn of the organic light emitting diode, the first electrode 324 and the second electrode 326 are in contact with each other or electrically connected to each other, the resistance RE2 by the organic light emitting layer 130 is removed from the pixel so that only the resistances R12 and R22 by the conductive material of the first electrode 324 and the second electrode 326 remain.

When the first electrode 324 is formed of a transparent metallic oxide material having a relatively good conductivity, such as indium tin oxide (ITO) and indium zinc oxide (IZO), resistances R11, R12, . . . , R1n of the first electrode 324 are approximately 20Ω. Further, the resistances R21, R22, . . . , R2n of the second electrode 326 formed of metal are approximately 0.1Ω. In contrast, the resistances RE1, RE2, . . . , REn of the organic light emitting layer 330 are approximately 1 MΩ. Therefore, the resistances RE1, RE2, and REn of the organic light emitting layer 330 are much higher than the resistances R11, R12, . . . , R1n of the first electrode 324 and the resistances R21, R22, . . . , R2n of the second electrode 326. Therefore, a total resistance Rt1, Rt2, . . . , Rn of each of the pixels P1, P2, . . . , Pn is substantially equal to the resistances RE1, RE2, . . . , REn of the organic light emitting layer 330 (Rt≈RE).

Therefore, when the first electrode 324 and the second electrode 326 of the second pixel P2 are in contact with each other so that the second pixel P2 is short-circuit-circuited, the resistance RE2 of the organic light emitting diode of the pixel P2 is removed to be zero. Therefore, a total resistance Rt2 of the second pixel P2 is much lower than the total resistance Rt1, . . . , Rtn of other pixels P1, . . . , Pn (Rt2<<Rt1 . . . Rtn).

As a result, the current Ie between the first electrode 324 and the second electrode 326 mostly flows through the short-circuited pixel P2 and hardly flows through other pixels P1, . . . , Pn. Therefore, the luminance of the organic light emitting layer of the pixels P1, . . . , Pn is rapidly lowered or the organic light emitting layer does not emit light. The auxiliary electrode 322 having good conductivity is provided in the lighting apparatus and the signal is substantially applied to the first electrode 324 of each of the pixels P1, P2, . . . , Pn through the auxiliary electrode 322. Therefore, even though the specific pixel P2 is short-circuited, the reduction of the current in other pixels P1, . . . , Pn may be minimized by the auxiliary electrode 322. However, in this case, other pixels P1, . . . , Pn are affected by the short-circuited pixel P2 so that the luminance of the entire lighting apparatus is lowered.

Furthermore, overcurrent Ie flows in the short-circuited pixel P2 so that a temperature of the short-circuited area is increased to deteriorate the organic light emitting material of the organic light emitting layer 330.

In order to suppress the above-described failure, in the present exemplary aspect, a connection pattern 324a is provided between the first electrode 324 and the auxiliary electrode 322 to provide a short-circuit reduction resistor in the pixels P1, P2, . . . , Pn of the organic light emitting diode.

Figure 9A:
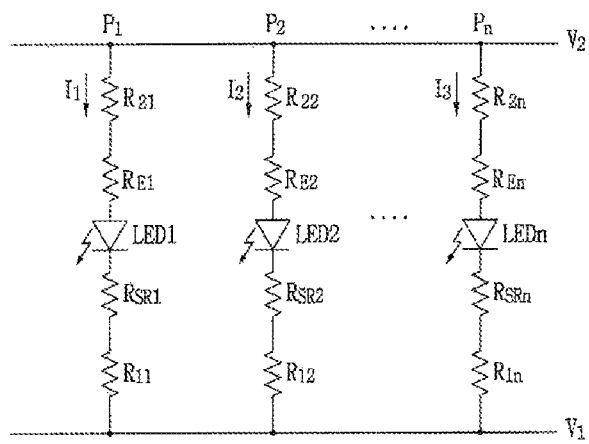
FIGS. 9A and 9B are circuit diagrams of an organic light emitting diode of a lighting apparatus according to a third exemplary aspect of the present disclosure.
Figure 9B:
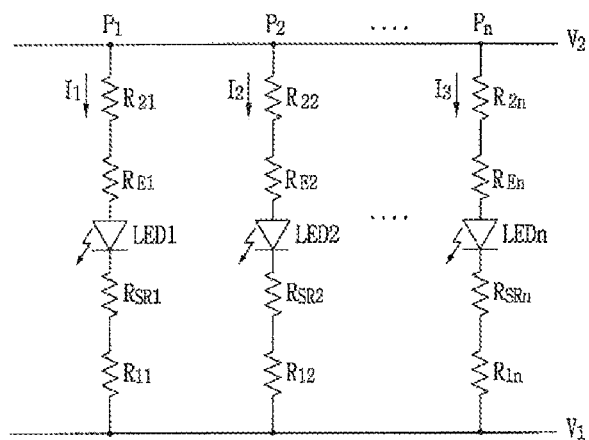

FIGS. 9A and 9B are circuit diagrams of an organic light emitting diode according to a third exemplary aspect which includes a separate short-circuit reduction resistor.

As illustrated in FIG. 9A, not only the resistors RE1, RE2, . . . , REn of the organic light emitting layer 330, the resistors R11, R12, . . . , R1n of the first electrode 324 and the resistors R21, R22, . . . , R2n of the second electrode 326, but also short-circuit reduction resistors RSR1, RSR2, . . . , RSRn are connected in series, in the plurality of pixels P1, P2, . . . , Pn which are connected in parallel. In this case, the short-circuit reduction resistors RSR1, RSR2, . . . , RSRn are formed by a connection pattern 324a.

In the organic light emitting diode with the above-described structure, voltages V1 and V2 are applied to the first electrode 324 and the second electrode 326, respectively. Therefore, currents are applied to organic light emitting layers LED1, LED2, . . . , LEDn of the pixels P1, P2, . . . , Pn so that the organic light emitting layers LED1, LED2, . . . , LEDn emit light.

Since approximately same resistance is formed in the plurality of pixels P1, P2, . . . , Pn, light with approximately same luminance is emitted to the plurality of pixels so that uniform light may be output for the entire lighting apparatus.

As illustrated in FIG. 9B, when the first electrode 324 and the second electrode 326 of one pixel P2 among the plurality of pixels P1, P2, . . . , Pn of the organic light emitting diode are in contact with each other, the resistance RE2 by the organic light emitting layer 330 is removed so that only the resistances R12 and R22 by the conductive material of the first electrode 324 and the second electrode 326 and the short-circuit reduction resistance RSR2 by the connection pattern 324a remain.

When the first electrode 324 is formed of a transparent metallic oxide material having a relatively good conductivity, such as indium tin oxide (ITO) and indium zinc oxide (IZO), resistances R11, R12, . . . , R1n of the first electrode 324 are approximately 20Ω. Further, the resistances R21, R22, . . . , R2n of the second electrode 326 formed of metal are approximately 0.1Ω. In contrast, the resistances RE1, RE2, . . . , REn of the organic light emitting layer 130 are approximately 1 MΩ. Therefore, when the short-circuit reduction resistors RSR1, RSR2, . . . , RSRn are not provided, the resistances RE1, RE2, and REn of the organic light emitting layer 330 are much higher than the resistances R11, R12, . . . , R1n of the first electrode 324 and the resistances R21, R22, . . . , R2n of the second electrode 326. Therefore, a total resistance Rt1, Rt2, . . . , Rn of each of the pixels P1, P2, . . . , Pn is substantially equal to the resistances RE1, RE2, . . . , REn of the organic light emitting layer 130 (Rt≈RE).

However, as illustrated in the drawing, when separate short-circuit reduction resistors RSR1, RSR2, . . . , RSRn are provided in each pixel, total resistances Rt1, Rt2, . . . , Rn of the pixels P1, P2, . . . , Pn are not substantially equal to the resistances RE1, RE2, . . . , REn of the organic light emitting layer 130.

Similarly to the resistances R11, R12, . . . , R1n of the first electrode 324 and the resistances R21, R22, . . . , R2n of the second electrode 326, when the short-circuit reduction resistances RSR1, RSR2, . . . , RSRn are formed to be several tens Ω or lower so that the short-circuit reduction resistances RSR1, RSR2, . . . , RSRn are much lower than the resistances RE1, RE2, . . . , REn of the organic light emitting layer 330, total resistances Rt1, Rt2, . . . , Rn of the pixels P1, P2, . . . , Pn are substantially equal to the resistances RE1, RE2, . . . , REn of the organic light emitting layer 130.

However, when the short-circuit reduction resistances RSR1, RSR2, . . . , RSRn are significantly higher than the resistances RE1, RE2, . . . , REn of the organic light emitting layer 130, the total resistances Rt1, Rt2, . . . , Rn of the pixels P1, P2, . . . , Pn are substantially equal to a sum of the resistances RE1, RE2, . . . , REn of the organic light emitting layer 330 and the short-circuit reduction resistances RSR1, RSR2, . . . , RSRn (Rt1, Rt2, . . . , Rn≈RE1, RE2, . . . , REn+RSR1, RSR2, . . . , RSRn).

As described above, when the short-circuit reduction resistors RSR1, RSR2, . . . , RSRn having a predetermined magnitude or more are provided in each of the pixels P1, P2, . . . , Pn, if the first electrode 324 and the second electrode 326 of the second pixel P2 are in contact with each other, the resistance RE2 of the organic light emitting diode of the pixel P2 is removed to be zero. Therefore, a total resistance Rt2 of the second pixel P2 is substantially equal to the short-circuit reduction resistance RSR2 (Rt2≈RSR2).

However, the short-circuit reduction resistance RSR2 is not so very lower than the resistance RE2 of the organic light emitting layer 130, but has a significant magnitude. Therefore, the current between the first electrode 324 and the second electrode 326 does not mostly flow through the short-circuit-circuited pixel P2, but a predetermined amount of current I2' flows through the pixel P2. In this case, even though an amount of current flowing through the second pixel P2 and an amount of current flowing through other pixels P1, . . . , Pn are different due to the difference in a total resistance of the second pixel P2 and other pixels P1, . . . , Pn (I2'≠I1', . . . , In'), the current flows through the entire pixels P1, P2, . . . , Pn. Therefore, a phenomenon in that the luminance of the organic light emitting layer of the plurality of pixels P1, P2, . . . , Pn is rapidly lowered or the organic light emitting layer does not emit light may be suppressed.

In the exemplary aspect, magnitudes of the short-circuit reduction resistances RSR1, RSR2, . . . , RSRn are appropriately set so that even though the first electrode 324 and the second electrode 326 of one pixel among the plurality of pixels P1, P2, . . . , Pn are in contact with each other, overcurrent does not flow through the short-circuit-circuited pixel but a set current flows. Therefore, the lowering of the luminance of the organic light emitting diode may be suppressed.

In this exemplary aspect, when the magnitudes of the short-circuit reduction resistances RSR1, RSR2, . . . , RSRn of the organic light emitting diode which is formed of the plurality of pixels P1, P2, . . . , Pn are approximately 2800 to 5500Ω, even though the first electrode 324 and the second electrode 326 of a specific pixel are in contact with each other, overcurrent does not flow through the short-circuit-circuited pixel but a set current flows. Therefore, all the pixels P1, P2, . . . , Pn of the organic light emitting diode may emit light.

To this end, in the exemplary aspect, the connection pattern 324a is formed to have set width and length, to form short-circuit reduction resistances RSR1, RSR2, . . . , RSRn having a magnitude of approximately 2800 to 5500Ω. Therefore, failure caused by the short-circuit of the pixels P1, P2, . . . , Pn may be suppressed.

In this case, the connection pattern 324a is formed by forming the first electrode 324 formed of ITO or IZO on the entire lighting apparatus including an upper portion of the auxiliary electrode 322 and forming an open area 325 formed by removing a part of the first electrode 324. However, the connection pattern 324a may be formed using the same material as the first electrode 324 or a different material from the first electrode by a different process from the first electrode 324 after separately forming the first electrode 324 and the auxiliary electrode 322.

A width and a length of the connection pattern 324a may be set such that the resistance value of the pixel has a magnitude of approximately 2800 to 5500Ω. However, when the width of the connection pattern 324a is too large, the resolution of the pixels P1, P2, . . . , Pn is deteriorated. Therefore, the width and the length of the connection pattern 324a may be set in consideration of the above condition.

As described above, according to the present disclosure, an auxiliary electrodes which transmits a signal to a first electrode is configured by a metal nano ink containing metal nanoparticles to reflect and scatter light, which is reflected from the interface between the first substrate and the external air layer, again, to minimize light loss between the first substrate and the external air layer, thereby improving an optical efficiency and a power efficiency of the lighting apparatus.

Further, in the present disclosure, a separate light extracting layer is provided to minimize light reflection from the interface between the first substrate and the first electrode, thereby further improving the optical efficiency of the lighting apparatus.

In the meantime, in the above detailed description, the lighting apparatus with a specific structure has been disclosed, but this is for the convenience of description, the present disclosure is not limited to a specific structure.

For example, in the above description, a bottom emission type lighting apparatus which downwardly outputs light has been described. However, the present disclosure is not limited to the bottom emission type lighting apparatus, but may be applied to a top emission type lighting apparatus which upwardly outputs light.

The exemplary aspects of the present disclosure can also be described as follows:

According to an aspect of the present disclosure, a lighting apparatus using an organic light emitting diode includes: a first substrate including a plurality of pixels, an auxiliary electrode disposed on the first substrate to define a plurality of pixels and apply a signal to the pixels; and an organic light emitting diode disposed in each pixel of the first substrate and including a first electrode, an organic light emitting layer, and a second electrode, in which the auxiliary electrode is made of metal nano ink to reflect and scatter light which is reflected from an interface between the first substrate and an external air layer to be incident again.

According to another aspect of the present disclosure, the first electrode may be made of transparent metal oxide.

According to still another aspect of the present disclosure, the metal nano ink may be configured by ink and metal nanoparticles dispersed in the ink.

According to still another aspect of the present disclosure, the metal nanoparticles may be at least one metal selected from one group consisting of gold, silver, platinum, copper, nickel, iron, cobalt, zinc, chrome, and manganese.

According to still another aspect of the present disclosure, the first electrode may be disposed on an upper surface of the first substrate.

According to still another aspect of the present disclosure, the lighting apparatus using an organic light emitting diode may further include a light extracting layer disposed between the first electrode and the first substrate.

According to still another aspect of the present disclosure, the lighting apparatus using an organic light emitting diode may further include a connection pattern disposed between the auxiliary electrode and the first electrode in each pixel to electrically connect the auxiliary electrode and the first electrode to each other and applying resistance value with a predetermined magnitude.

According to still another aspect of the present disclosure, the first substrate may be made of a flexible film or glass.

According to still another aspect of the present disclosure, the lighting apparatus using an organic light emitting diode may further include a second substrate attached to the first substrate by an adhesive agent.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A lighting apparatus, comprising:
   a first substrate including a plurality of pixels;
   an auxiliary electrode disposed on the first substrate in a matrix shape and defining the plurality of pixels;
   an organic light emitting diode disposed in each pixel of the first substrate and including a first electrode, an organic light emitting layer, and a second electrode; and
   a protective layer disposed above the first electrode except for an emission area to cover the auxiliary electrode and the first electrode disposed above the auxiliary electrode,
   wherein the auxiliary electrode is formed of metal nano ink and keeps reflecting and scattering light emitted from the organic light emitting diode at an interface between the first substrate and an external air layer, and
   wherein an electrical signal is supplied to the matrix shape auxiliary electrode and transmitted through the first electrode to drive the plurality of pixels, and
   wherein the auxiliary electrode does not overlap the emission area.

2. The lighting apparatus according to claim 1, wherein the first electrode is formed of transparent metal oxide.

3. The lighting apparatus according to claim 1, wherein the metal nano ink includes ink and a plurality of metal nanoparticles dispersed in the metal nano ink.

4. The lighting apparatus according to claim 3, wherein the plurality of metal nanoparticles includes at least one metal selected from one group consisting of gold, silver, platinum, copper, nickel, iron, cobalt, zinc, chrome, and manganese.

5. The lighting apparatus according to claim 1, wherein the first electrode is disposed on an upper surface of the first substrate.

6. The lighting apparatus according to claim 1, further comprising a light extracting layer disposed between the first electrode and the first substrate and improving light extraction efficiency.

7. The lighting apparatus according to claim 1, further comprising a connection pattern disposed between the auxiliary electrode and the first electrode of each pixel, electrically connecting the auxiliary electrode and the first electrode with each other and applied with a resistance value with a predetermined magnitude.

8. The lighting apparatus according to claim 1, wherein the first substrate includes a flexible film or glass.

9. The lighting apparatus according to claim 1, further comprising a second substrate attached to the first substrate by an adhesive agent.

10. The lighting apparatus according to claim 1, wherein the auxiliary electrode includes a first side contacting the first electrode and a second side contacting the first substrate, and
    wherein the first side has a flat surface and the second side has a rough surface by randomly dispersed metal nanoparticles to reflect and scatter the light emitted from the organic light emitting diode at the interface between the first substrate and the external air layer.

11. An organic light emitting device, comprising:
    a plurality of pixels defined at first and second substrates;
    a light extraction enhancing pattern disposed on the first substrate in a matrix type and defining the plurality of pixels;
    an organic light emitting diode disposed in each pixel of the first substrate and including a first electrode, an organic light emitting layer, and a second electrode; and
    a protective layer disposed above the first electrode except for an emission area to cover the light extraction enhancing pattern and the first electrode disposed above the light extraction enhancing pattern,
    wherein the light extraction enhancing patterns improves light extraction by repeating reflecting and scattering light emitted from the organic light emitting diode at an interface between the first substrate and an external air layer,
    wherein an electrical signal is supplied to the matrix type light extraction enhancing pattern and transmitted through the first electrode to drive the plurality of pixels, and
    wherein the light extraction enhancing pattern does not overlap the emission area.

12. The organic light emitting device according to claim 11, wherein the light extraction enhancing pattern is formed of a plurality of metal nanoparticles dispersed in metal nano ink.

13. The organic light emitting device according to claim 11, wherein the first electrode is formed of transparent metal oxide.

14. The organic light emitting device according to claim 12, wherein the plurality of metal nanoparticles includes at least one metal selected from one group consisting of gold, silver, platinum, copper, nickel, iron, cobalt, zinc, chrome, and manganese.

15. The organic light emitting device according to claim 11, wherein the first electrode is disposed on an upper surface of the first substrate.

16. The organic light emitting device according to claim 11, further comprising a light extracting layer disposed between the first electrode and the first substrate to improve light extraction efficiency.

17. The organic light emitting device according to claim 11, further comprising a connection pattern disposed between the light extraction enhancing pattern and the first electrode of each pixel, electrically connecting the light extraction enhancing pattern and the first electrode with each other and applied with a resistance value with a predetermined magnitude.

18. The organic light emitting device according to claim 11, wherein the first substrate includes a flexible film or glass.

19. The organic light emitting device according to claim 11, wherein the first and second substrates are attached with each other by an adhesive agent.

20. The organic light emitting device according to claim 11, wherein the auxiliary electrode includes a first side contacting the first electrode and a second side contacting the first substrate, and
   wherein the first side has a flat surface and the second side has a rough surface by randomly dispersed metal nanoparticles to reflect and scatter the light emitted from the organic light emitting diode at the interface between the first substrate and the external air layer.

* * * * *